United States Patent
Wang et al.

(10) Patent No.: US 9,947,441 B2
(45) Date of Patent: Apr. 17, 2018

(54) INTEGRATED SUPERCONDUCTOR DEVICE AND METHOD OF FABRICATION

(71) Applicant: Varian Semiconductor Equipment Associates, Inc., Gloucester, MA (US)

(72) Inventors: Connie P. Wang, Mountain View, CA (US); Paul Murphy, Reading, MA (US); Paul Sullivan, Wenham, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 269 days.

(21) Appl. No.: 14/077,901

(22) Filed: Nov. 12, 2013

(65) Prior Publication Data
US 2015/0348682 A1   Dec. 3, 2015

(51) Int. Cl.
| | | |
|---|---|---|
| H01L 39/24 | (2006.01) | |
| H01B 12/06 | (2006.01) | |
| H01B 13/30 | (2006.01) | |
| H01L 39/14 | (2006.01) | |
| H01L 39/16 | (2006.01) | |
| H02H 9/02 | (2006.01) | |

(52) U.S. Cl.
CPC ............. *H01B 12/06* (2013.01); *H01B 13/30* (2013.01); *H01L 39/143* (2013.01); *H01L 39/16* (2013.01); *H01L 39/2464* (2013.01); *H02H 9/023* (2013.01); *H01L 39/249* (2013.01); *H01L 39/2458* (2013.01); *H01L 39/2461* (2013.01)

(58) Field of Classification Search
CPC .......... H01B 12/06; H01B 13/30; H01L 39/16

USPC ........................................................ 505/237
See application file for complete search history.

(56) References Cited

U.S. PATENT DOCUMENTS

| | | | |
|---|---|---|---|
| 4,964,945 A | | 10/1990 | Calhoun |
| 4,999,597 A | * | 3/1991 | Gaynor ................ H01P 1/2039 |
| | | | 333/246 |
| 5,407,903 A | | 4/1995 | Nakamura et al. |
| 5,468,973 A | | 11/1995 | Harada et al. |
| 5,547,922 A | | 8/1996 | Ma |
| 5,672,569 A | * | 9/1997 | Nakamura ........ H01L 21/76891 |
| | | | 257/E21.594 |

(Continued)

FOREIGN PATENT DOCUMENTS

| | | |
|---|---|---|
| EP | 0358879 A2 | 3/1990 |
| GB | 2250517 A | 6/1992 |

(Continued)

OTHER PUBLICATIONS

International Search Report and Written Opinion dated Jul. 31, 2015 in corresponding PCT/US2014/064739.

(Continued)

*Primary Examiner* — Paul Wartalowicz (57) ABSTRACT

An integrated superconductor device may include a substrate base and an intermediate layer disposed on the substrate base and comprising a preferred crystallographic orientation. The integrated superconductor device may further include an oriented superconductor layer disposed on the intermediate layer and a conductive strip disposed on a portion of the oriented superconductor layer, The conductive strip may define a superconductor region of the oriented superconductor layer thereunder, and an exposed region of the oriented superconductor layer adjacent the superconductor region.

7 Claims, 9 Drawing Sheets

(56) References Cited

U.S. PATENT DOCUMENTS

| | | | |
|---|---|---|---|
| 5,828,291 A | 10/1998 | Baumann et al. | |
| 2001/0007707 A1* | 7/2001 | Kinder | C23C 14/22 428/131 |
| 2004/0168636 A1* | 9/2004 | Savvides | C23C 14/083 118/723 CB |
| 2006/0057240 A1 | 3/2006 | Koinuma et al. | |
| 2007/0139976 A1 | 6/2007 | deRochemont | |
| 2007/0148330 A1 | 6/2007 | Xiong et al. | |
| 2007/0197045 A1* | 8/2007 | Backer | C23C 18/06 438/758 |
| 2007/0197395 A1* | 8/2007 | Kodenkandath | H01L 39/143 505/210 |
| 2008/0210454 A1 | 9/2008 | Fee et al. | |
| 2009/0086386 A1* | 4/2009 | Sargent | H01L 39/16 361/19 |
| 2009/0233798 A1 | 9/2009 | Madea et al. | |
| 2009/0298697 A1 | 12/2009 | Zhang et al. | |
| 2011/0160066 A1* | 6/2011 | Aytug | C23C 14/024 505/434 |
| 2011/0319271 A1* | 12/2011 | Selvamanickam | H01L 39/2461 505/231 |
| 2012/0181062 A1* | 7/2012 | Neumuller | H01L 39/143 174/125.1 |
| 2012/0238454 A1* | 9/2012 | Yoshizumi | H01L 39/2461 505/237 |
| 2013/0137579 A1* | 5/2013 | Nagasu | H01B 12/02 505/150 |
| 2014/0038829 A1 | 2/2014 | Hahafusa et al. | |

FOREIGN PATENT DOCUMENTS

| | | |
|---|---|---|
| JP | H0284732 A | 3/1990 |
| WO | 99/15719 A1 | 4/1999 |
| WO | 2012165109 A1 | 12/2012 |
| WO | 2012165504 A1 | 12/2012 |

OTHER PUBLICATIONS

Supplementary European Search Report dated May 18, 2017 for European Patent Application No. 14880450.3.

* cited by examiner

INTEGRATED SUPERCONDUCTOR DEVICE AND METHOD OF FABRICATION

FIELD

The present embodiments relate to superconducting materials and, more particularly, to integrated superconductor current limiters.

BACKGROUND

Superconducting wires or tapes have been developed based upon high temperature superconducting (HTc) materials which may have critical temperatures TC above 77 K, facilitating their use in cryogenic systems cooled by liquid nitrogen. In certain applications, such as use in superconducting fault current limiters (SCFCL), high temperature superconducting (HTS) tapes may experience high temperature excursions in the case of a fault, in which the superconducting layer undergoes a transition to non-superconducting state.

The synthesis of HTS tapes involves many challenges including the need to form a complex stack of materials that constitute the HTS tape. Often, a superconductor layer of the superconductor tape is formed on a metallic substrate that is in the form of a ribbon or tape structure which serves as the template for growth of necessary layers for forming the superconductor tape. The metallic substrate is often processed by drawing the tape through a series of deposition and processing chambers that are used to form the multiple layers on the metallic tape. In order to provide sufficient current carrying capabilities in the resultant superconductor tape, the crystalline superconductor material is grown in a manner to promote a specific crystallographic orientation or "texture" of the resulting layer. The conventional HTS crystalline superconductor material is chosen from a class of layered complex oxides, in which current carrying copper oxide layers are oriented within a plane perpendicular to the c-axis of the crystallographic unit cell. Accordingly, it is desirable to form a c-axis texture of the superconductor tape in which the current carrying layers of the superconductor tape lie parallel to the plane of the tape. This entails the deposition of at least one intermediate layer, and often several layers, that separate the metallic tape substrate from the superconductor layer. The intermediate layers may play multiple roles including use as a diffusion barrier to prevent interdiffusion of the metallic tape material and superconductor layer, as well as use as a crystalline template from which a highly crystallographically oriented superconductor layer can be grown.

After formation of the superconductor layer, a metallic overlayer may be formed on the superconductor layer to serve as a conductive layer to conduct current during a fault condition in which the superconductor layer is in a non-superconducting state. Once the complete stack of layers that constitutes a superconductor tape is formed, the tape may be assembled into a current limiter by fastening tape portions together to form an set of multiple, extended, conductive paths. The tape portions are mounted in a module that provides mechanical strength and convenient handling of the superconductor tapes for assembly into a current limiter device.

In view of the above it may be appreciated that the formation of superconductor tapes, in particular for current limiter applications, requires extensive and complex processing. It is with respect to these and other considerations that the present improvements are needed.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one embodiment, an integrated superconductor device may include a substrate base and an intermediate layer disposed on the substrate base and comprising a preferred crystallographic orientation. The integrated superconductor device may further include an oriented superconductor layer disposed on the intermediate layer and a conductive strip disposed on a portion of the oriented superconductor layer. The conductive strip may define a superconductor region of the oriented superconductor layer thereunder, and an exposed region of the oriented superconductor layer adjacent the superconductor region.

In a further embodiment, a method to form a superconductor device may include depositing a crystalline layer having a preferred crystallographic orientation on a substrate, forming an oriented superconductor layer comprising an oriented superconductor material on the crystalline layer; depositing a conductive strip having a having a non-linear pattern; and treating an exposed portion of the oriented superconductor layer not covered by the conductive strip to transform the exposed portion into a non-superconductor material

DETAILED DESCRIPTION

The present embodiments will now be described more fully hereinafter with reference to the accompanying drawings, in which some embodiments are shown. The subject matter of the present disclosure, however, may be embodied in many different forms and should not be construed as limited to the embodiments set forth herein. Rather, these embodiments are provided so that this disclosure will be thorough and complete, and will fully convey the scope of the subject matter to those skilled in the art. In the drawings, like numbers refer to like elements throughout.

To address some of the deficiencies in the aforementioned superconductor tapes, embodiments are described herein that provide improved structure for superconductor tapes as well as improved techniques for forming superconductor tapes. These embodiments may be especially suited to applications of superconductor tapes are used to conduct current over a long current path arranged within a compact device, including current limiting devices.

To address problems of conventional superconductor tape fabrication, the present embodiments in particular provide an integrated superconductor device structure and fabrication techniques to generate a superconductor tape configuration that overcomes complexity associated with manufacture of stand-alone superconductor tapes. The resultant integrated superconductor devices effectively incorporate superconductor structures that are similar to tapes but are formed directly upon a large area substrate that occupies more surface area than that occupied by the superconductor structures. Thus, the integrated superconductor devices are characterized by a substrate that contains superconductor and non-superconductor regions across its surface. Although not formed as standalone tapes, such superconductor structures may be referred to herein as "tapes" because of the similarity of the morphology of the superconductor structures to conventional tapes.

In addition, the terms "superconductor" "superconductor element" or "superconductor material" as used herein, refer to a substance or object that has the capability of conducting electrical current without resistance. Thus a material such as $YBa_2Cu_3O_{7-x}$ (also referred to herein as "YBCO") may be referred to as a superconductor or superconductor material even when subject to a room temperature environment in which the material is not superconducting, since YBCO does become superconducting at temperatures below about 91 K.

The terms "superconducting" or "superconducting layer" on the other hand, are used herein to refer to properties of a tape or material. Thus, YBCO is superconducting under certain conditions, such as temperatures below 91 K or when current conducted by the YBCO material is below a critical current. Moreover, the term "non-superconducting" and "non-superconducting state" as used herein both refer to the state of a superconductor material in which the superconductor material does not have superconducting properties, such as when the superconductor material is subject to room temperature ambient.

In addition, the term "non-superconductor" as used herein, may refer to a material that is not capable of being superconducting. For example, a non-superconductor may include a material derived from a superconductor material such as YBCO, in which the material is altered, either chemically or structurally, from the parent superconductor material in a manner to render it incapable of becoming superconducting. Thus, a superconductor material may exist in superconducting state or non-superconducting state depending on conditions including temperature, electrical current density for current being conducted by the superconductor material, and the magnetic field applied to the material, etc. A non-superconductor material, on the other hand, may exist in a non-superconducting state regardless of temperature or other factors.

Finally, the terms "superconductor tape" and "superconductor layer" as used herein refer to tape, a tape-like structure or layer in which at least a portion of the respective tape-like structure or layer contains a superconductor material. Thus, a "superconductor tape" may include one or more layers of superconductor material and optionally one or more layers of non-superconductor material. Similarly, a "superconductor layer," after patterning, for example, may contain a portion that is made of superconductor material, and a portion in which the material is not a superconductor.

Figure 1A:
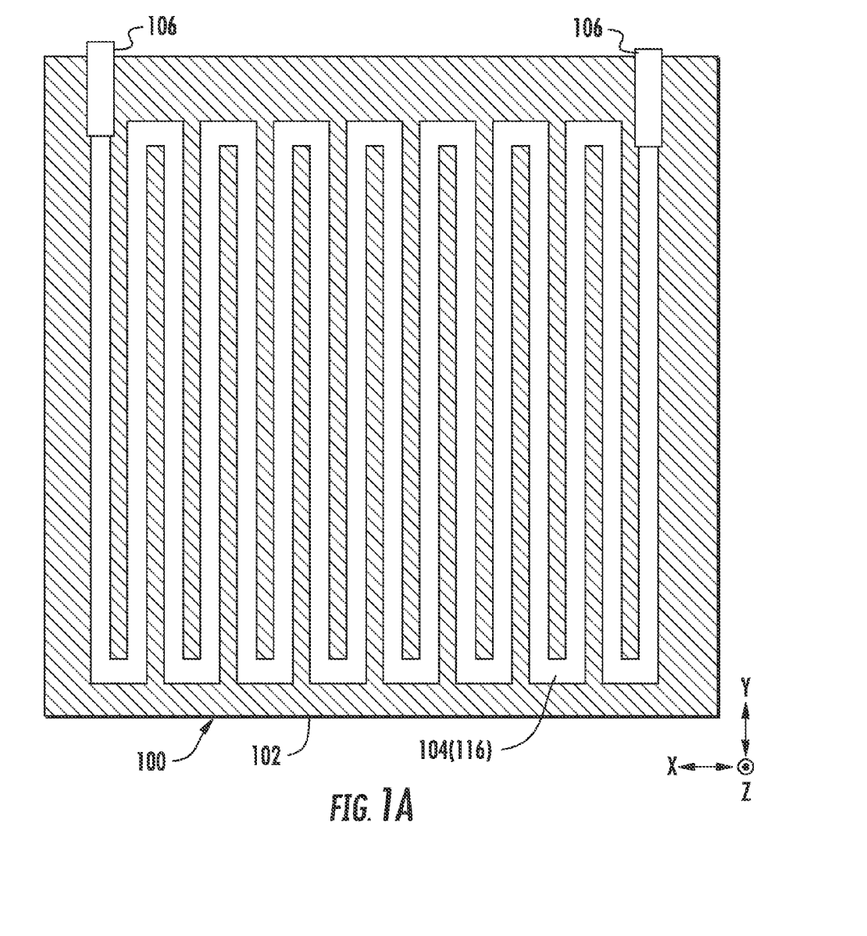
FIG. 1A and FIG. 1B depict a respective plan view and side cross-sectional view of an integrated superconductor device 100 consistent with the present embodiments.
Figure 1B:
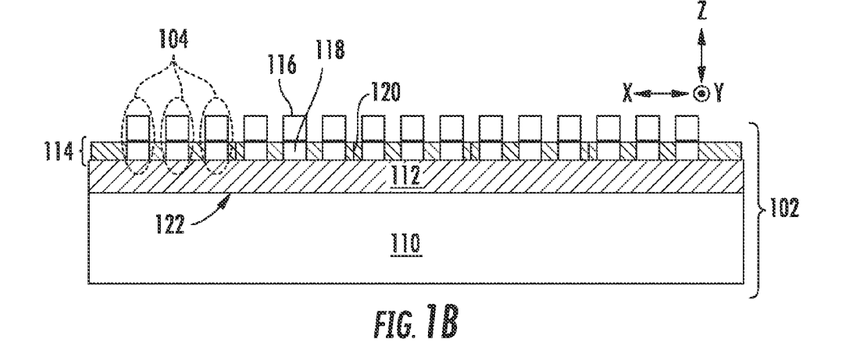
Figure 2A:
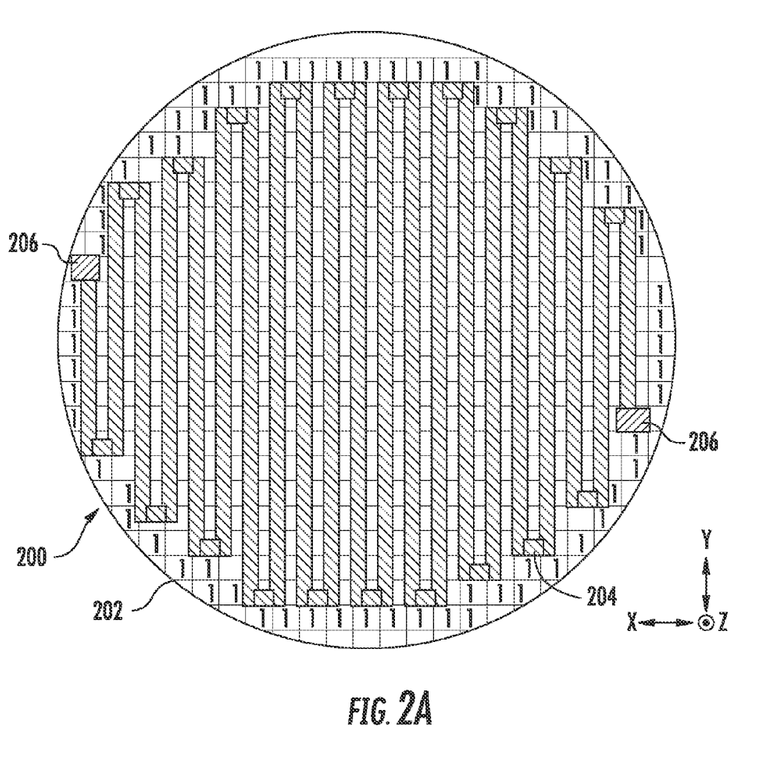
FIG. 2A depicts a plan view of an integrated superconductor device variant of the integrated superconductor device of FIGS. 1A, 1B.

FIG. 1A and FIG. 1B depict a respective plan view and side cross-sectional view of an integrated superconductor device 100 consistent with the present embodiments. FIG. 2A depicts a plan view of an integrated superconductor device 200 variant of the integrated superconductor device 100. The embodiments of FIG. 1A and FIG. 2A differ in that one has a rectangular shape and the other a round shape. In addition in both the integrated superconductor device 100, 200 a respective superconductor tape 104, 204 is integrated on a surface region of the respective substrates 102, 202.

Figure 2B:
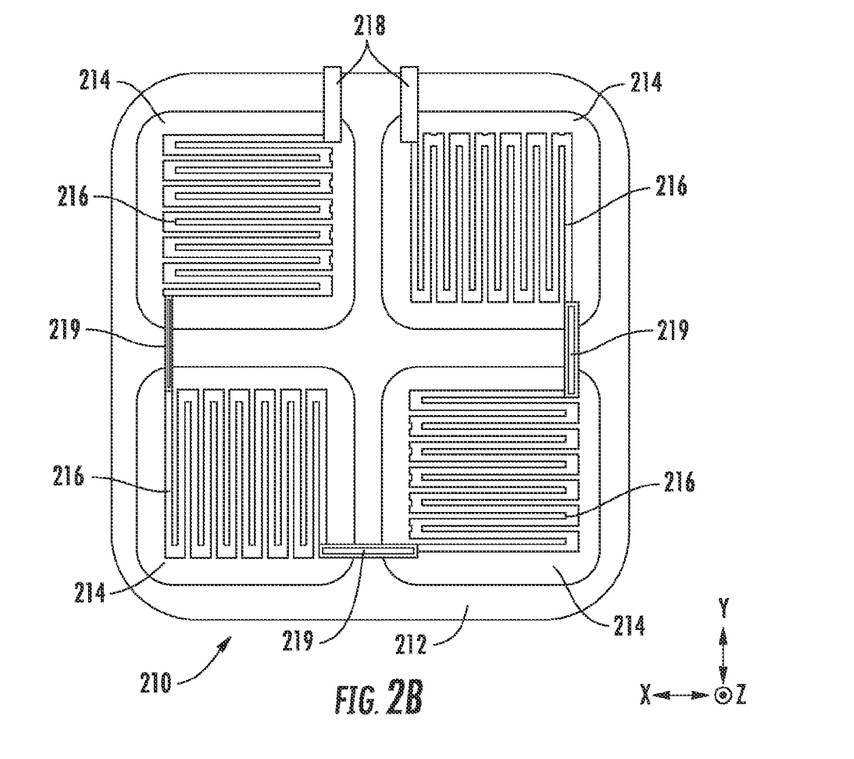
FIG. 2B depicts a plan view of an additional integrated superconductor device consistent with further embodiments of the disclosure.

FIGS. 2B and 2C depict plan views of additional integrated superconductor devices consistent with further embodiments of the disclosure. In FIG. 2B, the integrated superconductor device 210 is formed using a substrate 212 that contains four silicon regions 214 that are disposed on the surface of the integrated superconductor device 210. In one implementation, the integrated superconductor device 210 may be fabricated using silicon substrates appropriate for solar energy devices. In each silicon region 214 a superconductor tape 216 is formed in a serpentine pattern integrally within the silicon region 214, which serves as a substrate for the superconductor tape 216. Each superconductor tape 216 is connected to a superconductor tape 216 in an adjacent silicon region 214 via an electrical conductor 219 in a manner that a single conductive path is formed between contacts 218. In some embodiments, the conductive path length may be one to three meters.

Figure 2C:
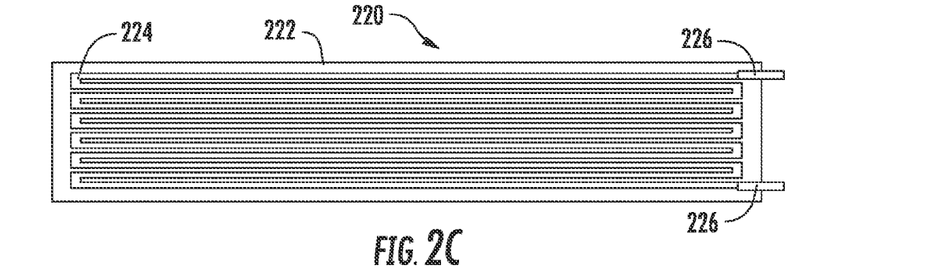
FIG. 2C depicts a plan view of an additional integrated superconductor device consistent with further embodiments of the disclosure.

In FIG. 2C, the integrated superconductor device 220 is formed using a silicon ribbon 222 that acts as a substrate within which a superconductor tape 224 is formed on the surface of the silicon ribbon 222. The superconductor tape 224 forms a serpentine pattern that forms a continuous path between the contacts 226. In one example, the silicon ribbon 222 is formed by the float zone method and has a width of 200 to 400 mm and length of two to four meters, resulting in a conductive path length of 50 to 100 meters. Other embodiments of substrates for forming integrated superconductor devices are possible.

Turning now in particular to the embodiment of FIGS. 1A, 1B it is be noted that the further features and issues discussed with respect to the integrated superconductor device 100 may equally apply to the integrated superconductor devices 200, 210, and 220. One characteristic feature of the integrated superconductor device 100 is that the superconductor tape 104 is integrated into the substrate 102. In particular the superconductor tape is fabricated by forming multiple layers on a substrate base 110, and thereafter defining the tape structure of the superconductor tape within at least some of those layers. This process results in a unitary structure of the integrated superconductor device 100 in which the superconductor tape 104 is an integral part.

As illustrated in FIGS. 1A and 2, a superconductor tape 104, 204 is arranged in a serpentine structure within the X-Y plane of the Cartesian coordinate system shown, which lies within the plane of the respective substrate 102, 202. The structure of the respective superconductor tapes 104, 204 serves to define a relatively long current path for current conducted between respective contacts 106, 206 that are disposed at opposite ends of the respective superconductor tapes 104, 204. In other words, in comparison to a width of the respective integrated superconductor devices 100, 200 along the X-direction, the current path length between respective contacts 106, 206, may be many times longer. The integrated superconductor devices 100, 200, 210, 220 may be suited for applications such as current limiter of a superconducting fault current limiter. However, the embodiments are not limited in this context.

Turning again to FIG. 1B, in accordance with various embodiments, the substrate base 110 may be a glass material, a polycrystalline material, or a single crystalline material. Examples of a polycrystalline material include alumina while examples of a single crystalline material include silicon or sapphire. The embodiments are not limited in this context. In some embodiments, the substrate base 110 may present a low roughness surface, such as is characteristic of glass substrates or single crystalline substrates. Moreover, the substrate base 110 may present few if any grain boundaries on its surface 120, thereby facilitating growth of a smoother layer stack. In the present embodiments an intermediate layer is disposed between the substrate base and a superconductor layer. An intermediate layer is represented in FIG. 1B by the layer 112, which is disposed on the substrate base 110 and may include multiple sub-layers (referred to herein simply as layers) or a single layer. The layer 112 in particular includes at least one layer that exhibits preferred crystallographic orientation and is disposed in a top portion of the layer 112. The term "preferred crystallographic orientation" refers to a quality of the microstructure of the layer in which crystallites of the layer have a non-random distribution of orientations such that certain crystallographic directions are preferentially oriented perpendicularly to a plane 107 of the substrate 100 as compared to the orientation of crystallites in a random polycrystalline powder. The top of layer 112 which may in particular serve as a template for growth of a high quality superconductor layer 114 as detailed below.

As further shown in FIG. 1B the structure of the superconductor tape 104 includes a top metal structure 116 which covers a superconductor region 118 disposed within the superconductor layer 114. As shown in FIG. 1A, the metal structure 116 may form a conductive strip that has a serpentine structure so that the superconductor region 118 has a similar serpentine structure. Adjacent the superconductor region 118 is an altered superconductor region 120 which is a non-superconductor. The resultant structure of the integrated superconductor device 100 comprises a serpentine superconductor tape that includes a metal overlayer, metal structure 116 and a superconductor underlayer, superconductor region 118.

As detailed below, definition of the superconductor region 118 and the altered superconductor region 120 may be accomplished through various approaches that are compatible with high volume manufacturing. Accordingly the entire process for fabrication of the integrated superconductor device 100 may be performed using materials, processes, and equipment compatible with high volume manufacturing.

Figure 3A:
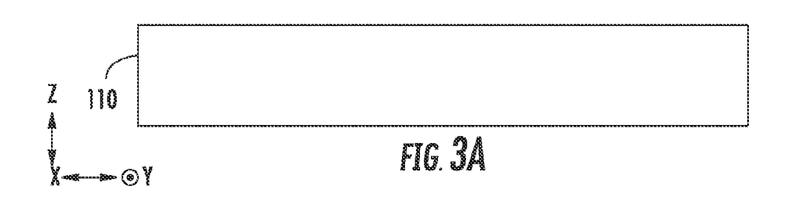
FIGS. 3A to 3E illustrate exemplary stages for fabricating an integrated superconductor device according to an embodiment of the disclosure.

FIGS. 3A to 3E illustrate exemplary stages for fabricating an integrated superconductor device according to an embodiment of the disclosure. In FIG. 3A, the substrate base 110 is provided for deposition of a layer or set of layers to form the integrated superconductor device. As discussed, the substrate base 110 may be a single crystalline material such as silicon or sapphire in some instances. In other instances, the substrate base 110 may be a glass. The substrate base 110 may have a dimension compatible for processing in conventional deposition apparatus. For example, in one instance the substrate is a 300 mm diameter Si (100) substrate. The embodiments are not limited in this context however.

Figure 3B:
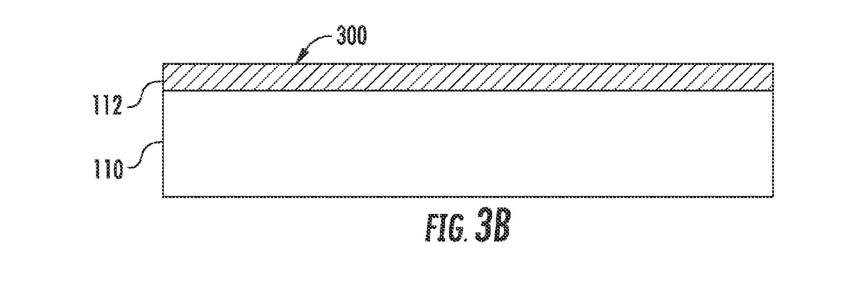

In FIG. 3B a layer 112 is deposited on the substrate base (110). In various embodiments the layer 112 may comprise multiple layers. The number of constituent layers that make up the layer 112 and the composition as well as structure of such layers may vary according to the nature of the substrate base (110). In some embodiments, a single layer or group of layers that constitute the layer 112 may be formed according to conventional techniques.

Figure 4A:
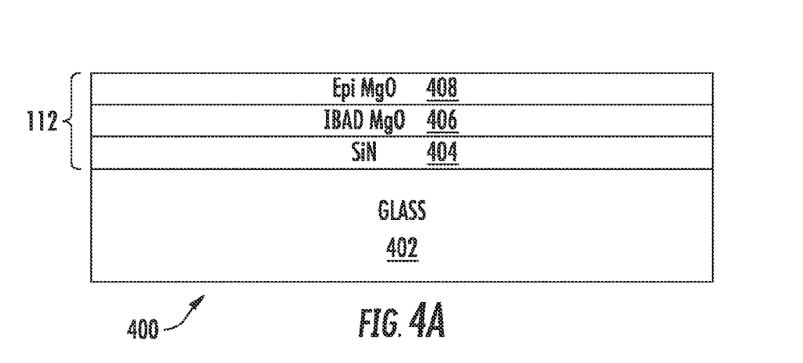
FIG. 4A depicts an exemplary layer stack for an embodiment in which a substrate includes a substrate base made of glass.

FIG. 4A depicts an exemplary layer stack that constitutes the layer 112, for an embodiment in which a substrate 400 includes a substrate base 402 made of glass. As illustrated, a layer 404 may be silicon nitride layer (SiN), which is deposited in contact with the glass substrate 402. In one variant the layer 404 may instead be $Y_2O_3$. In either of these variants the layer 404 may be deposited by known methods, such as sputtering, evaporation, chemical vapor deposition, or other method.

A further layer 406 is deposited upon the layer 404, which may be MgO. The MgO layer may serve as a crystalline template from which an oriented superconductor layer may subsequently be grown. In particular, the MgO layer may be deposited by ion beam assisted deposition (IBAD), which may form a crystalline MgO layer having a preferred crystallographic orientation (texture). The term "oriented superconductor layer" as used herein refers to a superconductor layer that has a preferred crystallographic orientation, such as a "c-axis" orientation.

In the embodiment of FIG. 4A, another layer 408 is formed upon the layer 406 before formation of the superconductor layer. The layer 408 may be an epitaxial MgO layer that is grown under conditions to provide a higher degree of crystalline orientation to the layer as opposed to the layer 406. In one instance the layer 408 may be grown in a separate process chamber than that used to grow the layer 406. For example, the layer 408 may be grown in a process chamber for chemical vapor deposition. In one variant, an optional epitaxial LaMnO3 layer (not shown) may be deposited upon the layer 408, for example, by reactive sputtering.

Figure 4B:
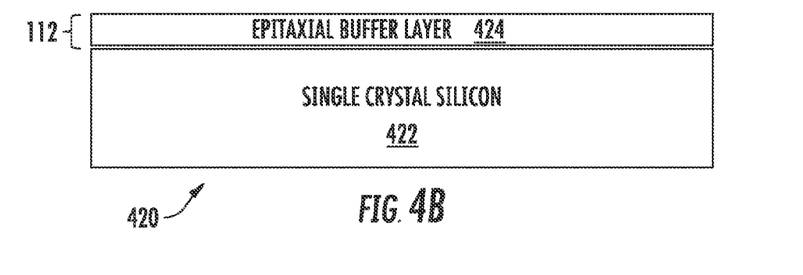
FIG. 4B depicts another variant for an embodiment in which a substrate includes a substrate base made of single crystalline silicon.

FIG. 4B depicts another variant of the layer 112, for an embodiment in which a substrate 420 includes a substrate base 422 made of single crystalline silicon. In this example the layer 112 may be a single layer that grows epitaxially on the silicon substrate. Examples of this include $CeO_2$ and $CaF_2$, each of which have the face centered cubic fluorite crystal structure, which space group is directly related to that of silicon. For this reason, highly oriented or single crystalline $CaF_2$ or $CeO_2$ may be grown on silicon. In particular, the lattice parameter of $CeO_2$ exhibits merely a 0.35% lattice mismatch with that of silicon, resulting in the ability to grow epitaxial layers of $CeO_2$ directly on silicon.

Returning to FIG. 3B, in the present embodiments after forming the layer or layers that constitute the layer 112, the top surface 300 of the layer 112 presents a crystallographically oriented surface for the growth of a subsequent superconductor layer. Because the underlying substrate base 110 may be a smooth substrate that is free of grain boundaries, the resulting layer 112 including the top surface 300 may present a superior template for growing a highly oriented superconductor layer as opposed to conventional superconductor tape technology that employs a metal tape substrate.

Figure 3C:
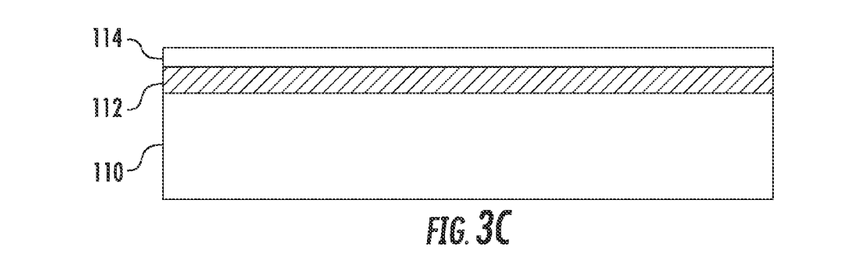

In FIG. 3C there is shown the formation of a superconductor layer 114 on the layer 112. The superconductor layer 114 is formed in a manner that results in a highly oriented superconductor material having its c-axis aligned along the Z-axis and perpendicularly to the plane of the substrate base 110, that is, the X-Y plane as shown. In various embodiments, the superconductor layer 114 is made of a superconductor material having the formula $ReBa_2Cu_3O_{7-x}$ (also referred to herein as "ReBCO") where Re stands for yttrium or any rare earth element. In other embodiments the superconductor layer 114 may be a bismuth strontium calcium copper oxide (BSCCO) of the general formula $Bi_2Sr_2Ca_{n-1}Cu_nO_{2n+4+x}$; a thallium strontium calcium copper oxide (TSCCO) of the general formula $Tl_2Sr_2Ca_{n-1}Cu_nO_{2n+4+x}$; mercury strontium calcium copper oxide (MSCCO) of the general formula $HgSr_2Ca_{n-1}Cu_nO_{2n+2+x}$. The embodiments are not limited in this context.

The superconductor layer 114 may be deposited by conventional processes for depositing a superconductor material, such as reactive co-evaporation or by metal organic chemical vapor deposition (MOCVD). The embodiments are not limited in this context. In some instances, for example in the case where superconductor layer 114 is an ReBCO material, an oxygenation annealing process may be performed after deposition of the superconductor layer 114. This serves to decrease the value of "x" in the ReBCO crystal structure so that the number of oxygen atoms per unit cell approaches 7. In this case the critical temperature and critical current at 77 K may increase, as well as the critical field for the superconductor layer 114.

Figure 3D:
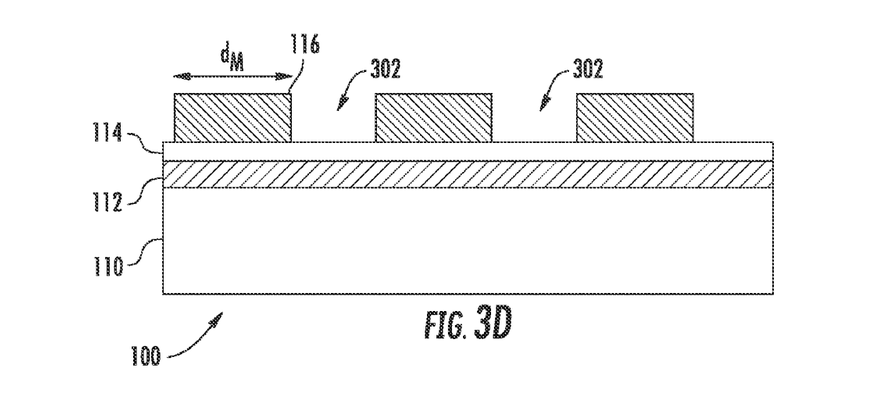

Turning now to FIG. 3D there is shown the deposition of metal structure 116 on portions of the superconductor layer 114. As shown in FIG. 1A and FIG. 1B, the metal structure 116 may be a single continuous metal line. In various embodiments, the metal structure 116 may be formed by known techniques such as screen printing, extrusion printing, or sputtering. The metal structure 116 may be formed from copper, silver, an alloy of copper, an alloy of silver. In some examples, the metal structure may be a bilayer structure in which a lower layer in contact with the superconductor layer 114 is silver or a silver alloy, and an upper layer is copper or a copper alloy. The embodiments are not limited in this context. Some exemplary thicknesses for the superconductor layer 114 along the Z direction range from one half micrometers to five micrometers. Some exemplary widths $d_M$ for the metal structure 116 range from 1 mm to 20 mm. As illustrated in FIG. 1A and FIG. 1B the metal structure 116 may define a long conductive path by having a serpentine shape. For example, in a 300 mm×300 mm square substrate, a serpentine metal structure having a width $d_M$ of 10 mm may define a conductive path of 4 meters in one instance. After formation of the metal structure 116, a sintering anneal may be performed in some embodiments.

Figure 3E:
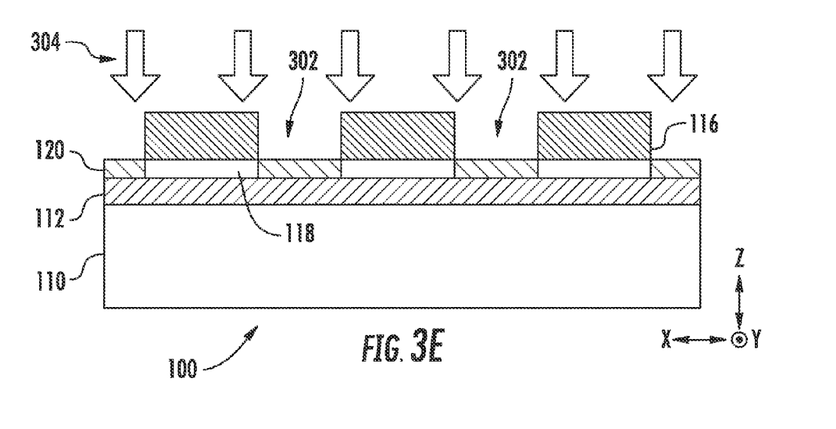

As further illustrated in FIG. 3D, the metal structure 116 serves to define an exposed region 302 of the superconductor layer 114 that is not covered by the metal structure 116. This exposed region 302 may be used to define a final superconductor tape structure as illustrated in FIG. 3E. As shown therein, an energetic treatment 304 is directed toward the substrate 100, which is shown schematically by the arrows. The energetic treatment 304 selectively affects the exposed region 302 so as to transform the exposed region 302 of the superconductor layer 114 into a non-superconductor region 120. At the same time portion of the superconductor layer 114 that lie underneath the metal structure 116 remain as superconductor regions 118.

In one variant, the energetic treatment 304 involves directing ions to the substrate 100. The ions are provided as an ion species and in an ion dose and ion energy that is effective to render the superconductor layer 114 into a non-superconducting material in exposed regions 302 that are not covered by the metal structure 116. For example nitrogen, boron or other low atomic weight ions may implant to depths of about 0.5 μm to 1 μm for ion energies in the range of 300 kV to 1 meV. Concomitant damage to superconductor material implanted with such ions may extend to greater depths such as about 1-2 μm. Accordingly, for superconductor tapes having a superconductor layer thickness in the range of 0.5-2 μm the process depicted in FIG. 3E may be conveniently performed in a medium energy or high energy beamline ion implantation apparatus in some embodiments. It is to be noted that for a high temperature superconductor material such as $YBa_2Cu_3O_{7-x}$ the material in exposed regions 302 need not be amorphized in order for those regions to be rendered as non-superconductor material. This is because the superconductivity properties are particularly sensitive to changes in the crystalline structure and stochiometry of the YBCO material.

Advantageously, the superconductor regions 118 disposed underneath metal structure 116 are screened from any damage from ions inasmuch as the thickness of the metal structure 116 may be on the order of 10-20 μm. Accordingly, a relatively small upper portion of the conductive strips 306 may be altered by implantation of ions 702. Moreover, even an ion dose sufficient to transform the exposed regions 302 into a non-superconducting material may merely increase electrical resistivity marginally in the implanted portions of the metal structure 116, resulting in a marginal increase in overall electrical resistance of the metal structure 116.

In another variant of the energetic treatment 304 heat flux is directed toward the substrate 110 in the form of conductive heating, convective heating or radiative heating or any combination thereof. In some embodiments the superconductor layer 114 is $RBa_2Cu_3O_{7-x}$ where R is a rare earth element. Such materials exhibit a strong dependence of superconductivity on oxygen stochiometry such that lower the oxygen content causes the material to exhibit poorer superconductivity or no superconductivity. In addition, oxygen mobility in such structures is relatively high such that heating under certain conditions may generate the release of oxygen, thereby reducing the oxygen content within the crystalline structure. Accordingly, the heat flux may be provided to deplete oxygen from $RBa_2Cu_3O_{7-x}$ material that is disposed in exposed region 302 that are not covered with the metal structure 116. The covered portions, superconductor regions 118, do not become depleted from oxygen and thereby remain as superconductor material.

Once the exposed region 302 becomes a non-superconductor material, the remaining superconductor regions 118 define a pattern within the substrate 100 that has the dimensions and shape of the metal structure 116, as shown in FIGS. 1A, 1B, and 3E. Thus, an integrated superconductor device is formed that provides a conductive path in a tape-like structure that contains a layer stack in which a normal conductor (metal structure 116) is disposed over a superconductor region 118. However, unlike free-standing superconductor tapes, the tape-like structure is integrated within a substrate such as the substrate base 110.

Subsequently to the formation of the superconductor tape 104 contacts 106 may be formed at either end of the superconductor tape 104 to serve as points for electrically connecting the superconductor tape 104 to other components including other integrated superconductor devices.

Figure 5A:
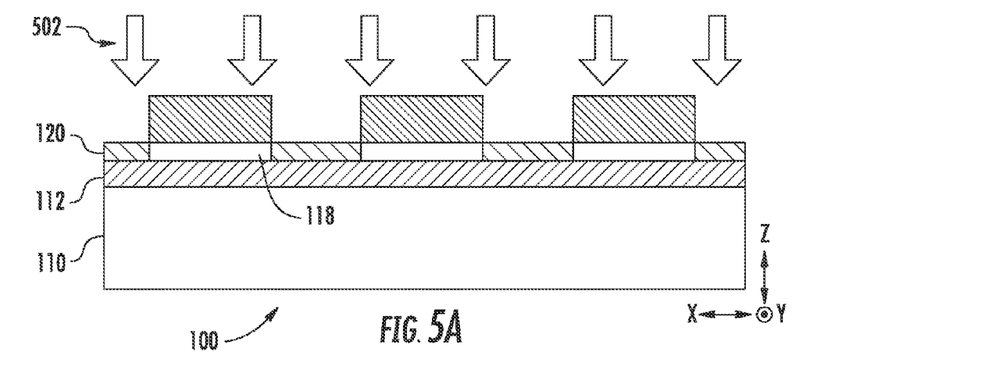
FIG. 5A, FIG. 5B, and FIG. 5C depict further operations involved in fabrication of another embodiment of an integrated superconductor device.
Figure 5B:
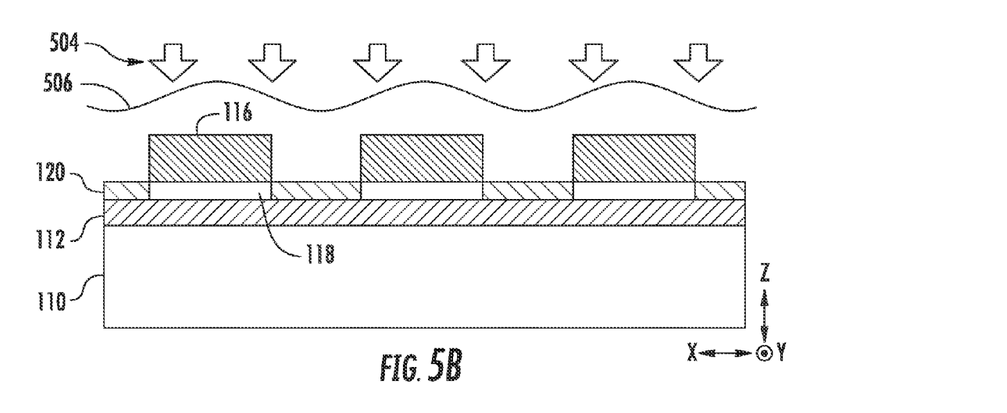
Figure 5C:
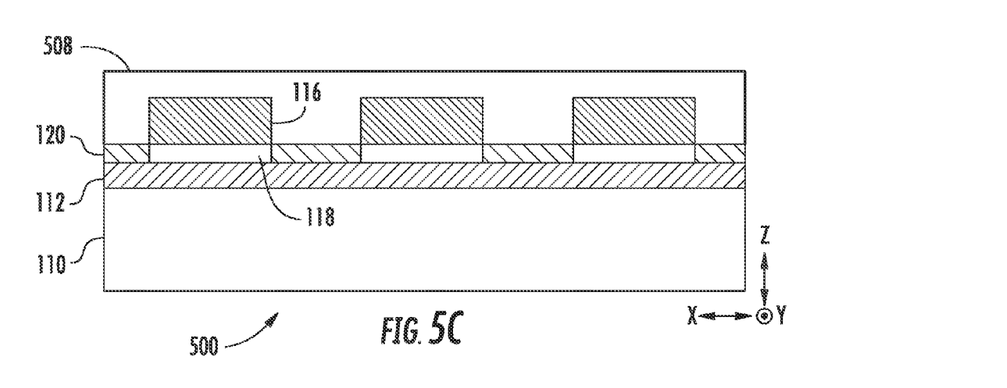

FIG. 5A, FIG. 5B, and FIG. 5C depict further operations involved in fabrication of another embodiment of an integrated superconductor device. In this embodiment, a dielectric coating is provided to cover and planarize surface features of the integrated superconductor device 100 to form a planarized superconductor device 500, as shown in FIG. 5C.

In FIG. 5A, dielectric coating material 502 is provided to the integrated superconductor device 100. The dielectric coating material 502 may be a conventional dielectric such as silicon oxide or other material, and may be provided by a chemical vapor deposition process, a wet chemical process, or other process. In FIG. 5B, there is shown an instance in which the dielectric coating material 502 has been deposited and forms a non-planar coating 506 that covers the metal structure 116 and the non-superconductor region 120. This non-planar coating 506 is subject to a planarization treatment 504 shown schematically by the arrows. The planarization treatment may be chosen from among known planarization treatments for dielectric material in some embodiments. In FIG. 5C, the non-planar coating 506 has been transformed into a planarized coating 508.

The planarized superconductor device 500 may protect the integrity of the underlying non-superconductor region 120 and superconductor region 118 so that the planarized superconductor device 500 can be conveniently handled or processed further for assembly into other apparatus such as a superconducting fault current limiter device. In particular, the planarized superconductor device 500 presents a modular component that can be conveniently assembled into apparatus containing multiple planarized superconductor devices 500. This may be accomplished, for example, by stacking multiple planarized superconductor devices 500 on top of one another and providing electrical connections between the planarized superconductor devices 500. This allows the current path of a current limiter to be increased to a desired length to meet requirements of a given fault current limiter device.

Figure 6A:
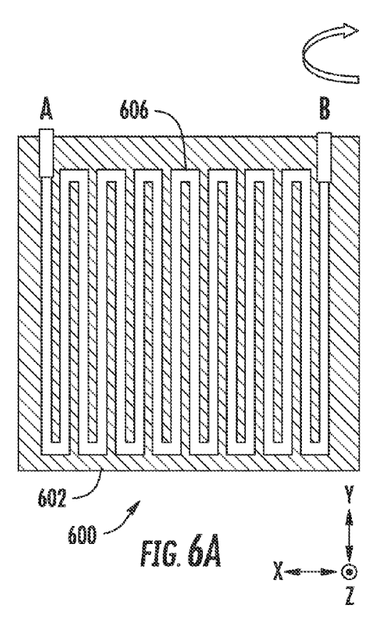
FIG. 6A and FIG. 6B depict a plan view of opposite sides of an integrated superconductor device according to a further embodiment.
Figure 6B:
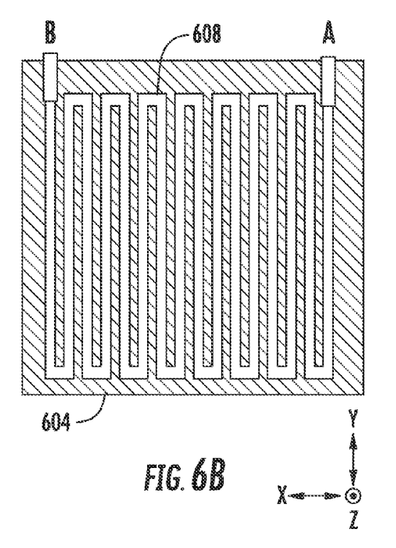

FIG. 6A and FIG. 6B depict a plan view of opposite sides of an integrated superconductor device according to a further embodiment. In this embodiment, an integrated superconductor device 600 includes a first side 602 and second side 604 opposite the first side 602 that each include a respective superconductor tape 606, 608 that is integrated into the integrated superconductor device 600. In some embodiments, each side 602, 604 may be formed using the same or similar set of processes illustrated for FIGS. 3A to 5C. In one instance, the first side 602 may be processed first to form a superconductor tape 606, followed by processing of the second side 604 in a similar manner to form the superconductor tape 608.

In various embodiments, the superconductor tape 606 on the first side 602 may be electrically connected to a superconductor tape 606 on the second side 604 in different manners. In one embodiment, the superconductor tape 606 on the first side 602 may be electrically connected to a superconductor tape 606 on the second side 604 so as to form a single continuous current path. In another embodiment, the superconductor tape 606 may be bifilar wound, the superconductor tape 608 may be bifilar wound and the pattern of the superconductor tape 606 may be bifilar with respect to that of the pattern of superconductor tape 608 within the X-Y plane as shown. In this manner the integrated superconductor device 600 may present a very low inductance component for a fault current limiter, for example.

Although the aforementioned embodiments have explicitly shown examples of conductive strips arranged in serpentine patterns to form superconductor tapes, in other embodiments different patterns may be used to form an integrated superconductor device. For example, a conductive strip may be arranged in various non-linear patterns, where a non-linear pattern refers to a strip that is not arranged in a single straight line. Examples of non-linear patterns include spiral patterns or other complex patterns.

Included herein is a flow chart representative of exemplary methodologies for performing novel aspects of the disclosed superconductor device structure. While, for purposes of simplicity of explanation, the one or more methodologies shown herein, for example, in the form of a flow chart or flow diagram, are shown and described as a series of acts, it is to be understood and appreciated that the methodologies are not limited by the order of acts, as some acts may, in accordance therewith, occur in a different order and/or concurrently with other acts from that shown and described herein. Moreover, not all acts illustrated in a methodology may be required for a novel implementation.

Figure 7:
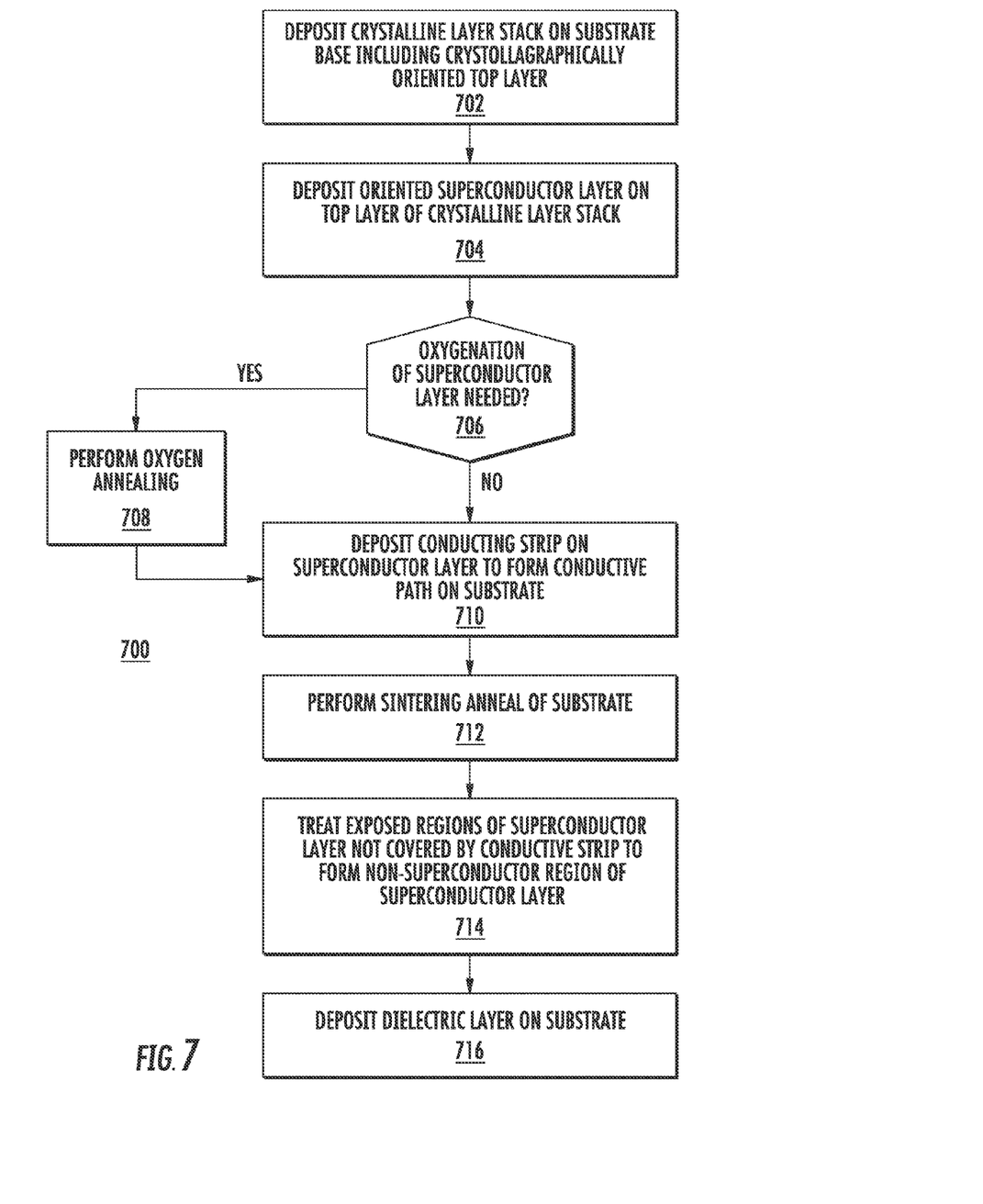
FIG. 7 presents an exemplary process flow for forming an integrated superconductor device.

FIG. 7 depicts an exemplary process flow 700 consistent with various embodiments. In block 702, a crystalline layer stack is deposited on a substrate base. The crystalline layer stack may include one or more layers in different embodiments. The crystalline layer stack may, for example, include a non-crystalline layer. However, the crystalline layer stack is configured so that the top layer is a crystallograhically oriented layer. In particular, the top layer may be oriented to provide a template for c-axis growth of a superconductor layer thereupon.

At block 704, an oriented superconductor layer is deposited on top of the crystalline layer stack. In various embodiments, this oriented superconductor layer is a HTS material such as a layered oxide including ReBCO, BSSCO, MSSCO, or TSSCO.

At decision block 706, if oxygenation of the superconductor layer is needed the flow proceeds to block 708, where an oxygen annealing process is performed. The flow then proceeds to block 710. If not oxygenation is needed the flow proceeds directly to block 710.

At block 710, a conductive structure in the form of a conductive strip is deposited upon the substrate. In particular, the conductive strip is deposited upon the surface of the superconductor layer. The conducting strip may form a conductive path and may have any desired shape, such as a serpentine shape, a spiral shape, or other shape. The conductive strip may be a metal such as copper or silver, and may be a bilayer of copper and silver in different embodiments. In addition, the conductive strip may be an alloy of the aforementioned materials.

The flow then proceeds to block 712 where a sintering anneal is performed. Subsequently, at block 714, exposed regions of the superconductor layer that are not covered by the conductive strip are treated in a manner that forms non-superconductor regions of the superconductor layer in the exposed regions. Examples of such treatment include annealing to deplete the exposed regions of the superconductor layer of oxygen, or ion implantation to damage or alter the exposed regions of the superconductor layer.

At block 716 a dielectric layer is deposited on the substrate, which may act as an encapsulant to protect the conductive strip as well as exposed regions of the superconductor layer than may be a non-superconductor material. In addition, if a further planarization process is performed, the dielectric layer may serve as a planarization layer.

In summary, the present embodiments provide multiple advantages over conventional superconductor tape technology in which superconductor tapes are fabricated as free standing tape structures. For one, the integration of a tape structure into a large area smooth substrate provides a more robust process for fabricating superconductive devices with reproducible properties. This is in part due to the smoothness of such substrates as compared to metal tapes used as substrates for conventional superconductor tapes. Moreover, the integrated superconductor devices may be fabricated in conventional processing apparatus used for high volume manufacturing such as semiconductor manufacturing, and may employ conventional substrates such as silicon wafers, sapphire wafers, glass substrates, and so forth. Additionally, the design parameters of superconductor devices may be conveniently adjusted by simply varying layout of the metal structure, for example, by varying design pattern of the metal structure, width of the metal structure, spacing between adjacent metal structure lines, and so forth. In addition, the integrated nature of the superconductor devices allows the superconductor tape components to be easily protected by conventional passivation processes and allows individual substrates to be connected into an assembly in a simple manner without complex connections. Also, the integrated design including top layer dielectric coating increases the mechanical stability of a superconductor tape structure including adhesion of the superconductor tape structure to its substrate. This further provides a convenient system for tuning resistance of the metallic portion of the superconductor tape and the critical current of the superconductor layer, which may lead to increased performance.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Thus, the claims set forth below should be construed in view of the full breadth and spirit of the present disclosure as described herein.

What is claimed is:

1. An integrated superconductor device, comprising:
    a substrate base formed of glass;
    an intermediate layer disposed on the substrate base, the intermediate layer having a preferred crystallographic orientation and comprising a layer of silicon nitride, a first layer of MgO disposed on the layer of silicon nitride, and a separate, second layer of MgO disposed on the first layer of MgO, the second layer of MgO having a higher degree of crystalline orientation relative to the first layer of MgO;
    an oriented superconductor layer disposed on the intermediate layer; and
    a conductive strip disposed on a portion of the oriented superconductor layer to define a superconductor region of the oriented superconductor layer thereunder, and an exposed region of the oriented superconductor layer adjacent the superconductor region;
    wherein the conductive strip defines a serpentine pattern.

2. The integrated superconductor device of claim 1, wherein the substrate comprises a first side and a second side, wherein the conductive strip is deposited on the first side, the integrated superconductor device further comprising:
    a second intermediate layer disposed on the substrate base on the second side, the second intermediate layer comprising a preferred crystallographic orientation;
    a second oriented superconductor layer disposed on the second intermediate layer; and
    a second conductive strip disposed on a portion of the second oriented superconductor layer to define a second superconductor region of the second oriented superconductor layer thereunder, and a second exposed region of the second oriented superconductor layer adjacent the second superconductor region, wherein the second conductive strip is electrically connected to the first conductive strip.

3. The integrated superconductor device of claim 2, wherein the first and second conductive strip comprise a bifilar wound structure.

4. The integrated superconductor device of claim 3, wherein the first and second conductive strip are bifilar with respect to one another.

5. The integrated superconductor device of claim 1, wherein the exposed region of the oriented superconductor layer comprises a defective superconductor material that is a non-superconductor.

6. The integrated superconductor device of claim 1, wherein the oriented superconductor layer comprises $RBa_2Cu_3O_{7-x}$ where R is a rare earth element.

7. The integrated superconductor device of claim 1, further comprising a protective coating disposed on the conductive strip and exposed region.

* * * * *